United States Patent [19]

Russell et al.

[11] 4,122,540

[45] Oct. 24, 1978

[54] MASSIVE MONOLITHIC INTEGRATED CIRCUIT

[75] Inventors: Lewis K. Russell, San Jose; David Kleitman, Los Altos Hills, both of Calif.

[73] Assignee: Signetics Corporation, Sunnyvale, Calif.

[21] Appl. No.: 675,776

[22] Filed: Apr. 12, 1976

Related U.S. Application Data

[63] Continuation of Ser. No. 452,195, Mar. 18, 1974, abandoned.

[51] Int. Cl.² .............................................. G11C 11/40
[52] U.S. Cl. ................................... 365/104; 307/238; 365/103; 365/200; 365/51
[58] Field of Search ....... 340/173 R, 173 FF, 173 SP; 307/238, 279; 365/104

[56] References Cited

U.S. PATENT DOCUMENTS

| | | | |
|---|---|---|---|
| 3,533,089 | 10/1970 | Wahlstrom | 340/173 R |
| 3,660,819 | 5/1972 | Frohman-Bentchkowsky | 340/173 R |

*Primary Examiner*—Terrell W. Fears
*Attorney, Agent, or Firm*—Jerry A. Dinardo; Jack Oisher; Frank R. Trifari

[57] ABSTRACT

In an integrated circuit, a semiconductor body having a surface, spaced semiconductor circuits formed in the body, intercoupling means formed in the body adjacent each of said circuits, and connected to said circuits. A plurality of conductive paths are formed between said intercoupling means and carried by the body. Each intercoupling means includes a plurality of semiconductor regions formed in the semiconductor body, said regions in combination capable of assuming a first low impedance condition and a second high impedance condition to thereby selectively couple each of said circuits to selected conductive paths or decouple each of said circuits from said conductive paths. In a specific embodiment of the invention a massive monolithic integrated circuit is configured using intercoupling means in combination with small scale random access memory semiconductor circuits. A static MOS random access memory having a 2,048 word capacity, with 9 bits/word and an 11 bit address is provided.

7 Claims, 12 Drawing Figures

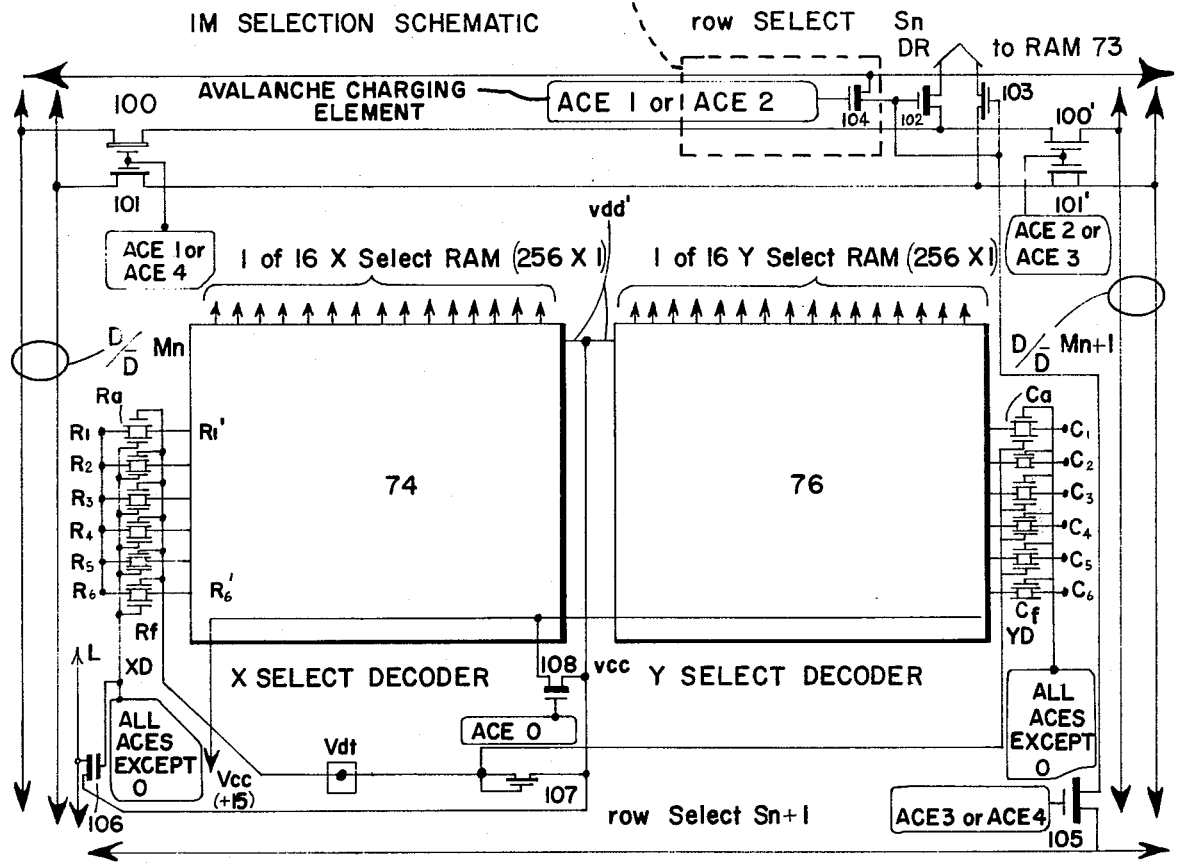
Fig. 10
O: NON-FUNCTIONAL
1: FUNCTIONAL BUT NOT CONFIGURED
⊙: FUNCTIONAL AND CONFIGURED
CONFIGURATION PATTERN FOR A RANDOMLY GENERATED MATRIX
Fig. 11
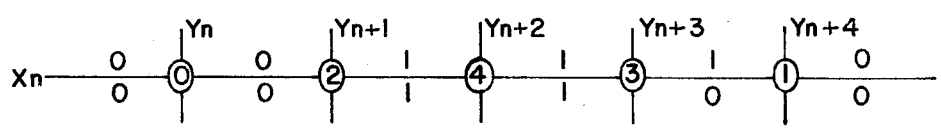
Fig. 12  Node sums for a portion of a Random Matrix

MASSIVE MONOLITHIC INTEGRATED CIRCUIT

This is a continuation of application Ser. No. 452,195 filed Mar. 18, 1974 now abandoned.

CROSS-REFERENCE TO RELATED APPLICATIONS

PSEUDO-COMPLEMENTARY DECODE DRIVER, Ser. No. 368,855, filed June 11, 1973, invented by Lewis K. Russell, abandoned in favor of continuation application Ser. No. 522,433, filed Nov. 11, 1974, now U.S. Pat. No. 3,970,865, issued July 20, 1976.

BACKGROUND OF THE INVENTION

This invention relates generally to a structure for configuring small-scale integrated circuits into a large scale integrated circuit and more particularly to the configuration of a plurality of semiconductor circuits, defined as unit circuits, formed in a semiconductor body to form a large scale functional integrated circuit. It is well known in the manufacture of integrated circuit bodies or wafers that as wafer size and complexity increase so also does the likelihood that manufacturing defects will be introduced and render the integrated circuit defective and inoperable. Various techniques for increasing the yield and reducing the likelihood of imperfect and malfunctioning circuits have been developed. One such technique known as discretionary wiring provides for the individual testing of circuits formed in the wafer, the mapping of functional circuits and the formation, by computer control, of a custom metallization mask, which then is used to form a unique metallization interconnecting layer connecting solely the functional sub-unit circuits. Key drawbacks of this technique are the cost of the computer processing of custom masks for each individual wafer in addition to the subsequent mask formation steps.

There is therefore a substantial need for a technique wherein a plurality of small scale semiconductor circuits or unit circuits may be formed in a semiconductor wafer. The functional circuits may then be segregated and thereafter easily and inexpensively configured or interconnected to form a large scale integrated circuit without the need for additional expensive processing steps.

OBJECTS AND SUMMARY OF THE INVENTION

In general it is an object of the present invention to provide a massive monolithic integrated circuit wherein a plurality of semiconductor circuits or unit circuits formed in a semiconductor body or wafer may be functionally tested and the properly functioning circuits easily and inexpensively interconnected to form a large scale integrated circuit.

Another object of the present invention is to provide a massive monolithic integrated circuit of the above character having plural intercoupling means formed in a semiconductor wafer for interconnection of sub-unit semiconductor circuits into a large scale integrated circuit.

The foregoing and other objects of the invention are achieved in a configurable massive monolithic integrated circuit and method for forming same.

A semiconductor body having a surface is provided with spaced semiconductor circuits formed in the body. Intercoupling means are formed in the body adjacent each of said circuits and are connected to said circuits. A plurality of conductive paths are formed between said intercoupling means and carried by the body. Each intercoupling means includes a plurality of semiconductor regions formed in the semiconductor body, said regions in combination being capable of assuming a first low impedance condition and a second high impedance condition to thereby selectively couple each of said circuits to selected conductive paths or decouple each of said circuits from said conductive paths.

BRIEF DESCRIPTION OF THE DRAWINGS

FIG. 10 is an avalanche charging element selection schematic showing transistor switches connected to the matrixed avalanche charging elements utilized in configuring the FIG. 9 block diagram and thus the random access memory embodiment of FIGS. 6 and 7.

FIG. 11 is an X-Y coordinate map representation of the functional and non-functional circuits in a generalized large scale or massive monolithic integrated circuit.

FIG. 12 is a portion of the FIG. 11 X-Y coordinate map representation showing node sums of the functional circuits at generalized intersections.

DESCRIPTION OF THE PREFERRED EMBODIMENTS

Figure 1:
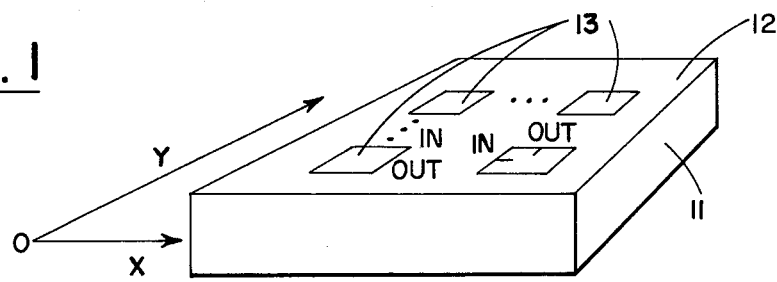
FIG. 1 is an isometric view of the general configuration of a large scale or massive monolithic integrated circuit formed in a semiconductor body including a repetitive pattern of predetermined semiconductor circuits.

The general configuration of the large scale or massive monolithic integrated circuit is shown in FIG. 1 and includes a semiconductor body 11 in the form of a wafer having a planar surface 12. A repetitive pattern of spaced predetermined semiconductor circuits 13 formed in the semiconductor body and extending to the planar surface 12 of body 11. The pattern of semiconductor circuits may be formed in a predetermined manner and may be of identical circuits 13 as shown formed in an equally spaced X and Y coordinate system and spaced over the surface 12 of the body. It is understood that the circuits may be further grouped into classes of circuits which are then interspersed as desired across the planar surface 12 of the body 11.

Each of these semiconductor circuits 13 may include active devices such as transistors and diodes as well as passive devices such as resistors and capacitors. In each case active or passive devices may be formed by conventional methods by forming regions and junctions positioned as desired within each of said semiconductor circuits 13 to provide a semiconductor unit circuit.

Figure 2:
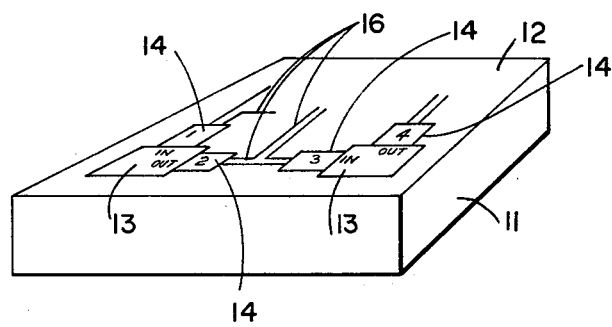
FIG. 2 is a portion of the FIG. 1 isometric view showing two semiconductor circuits, intercoupling means associated with the circuits and conducting paths connected to the intercoupling means.

As shown in FIG. 2 interconnecting means 14 are formed in the body adjacent each of said semiconductor circuits 13 and are connected to functional portions of said circuits 13, such as the input and output of said circuits, Interconnecting means 14 may be further designated according to the position of said means in the wafer surface 12, such as by means 14-1 being positioned in position 1, the input to a first unit circuit 13. Interconnecting means 14-2 is then accordingly connected to the output 2 of a first, representative unit circuit 13.

Interconnecting means for the purposes of the present invention may be broadly defined as including a plurality of semiconductor regions formed in the semiconductor body, said regions in combination capable of assuming a first low impedance and a second high impedance condition. Thus said means includes fusable means formed within the semiconductor body, wherein the fusable means includes a low impedance circuit capable of assuming a high impedance condition. Similarly, an "anti-fuse" includes means formed in the body having a condition opposite that of a conventional fuse, that is, an "open" or high impedance condition and capable of assuming a low impedance condition.

Intercoupling means 14 as above described are connected to patterned conductive paths 16 which are carried by the body and connect said intercoupling means in each position or location in a predetermined manner, as shown in FIG. 2.

Figure 3:
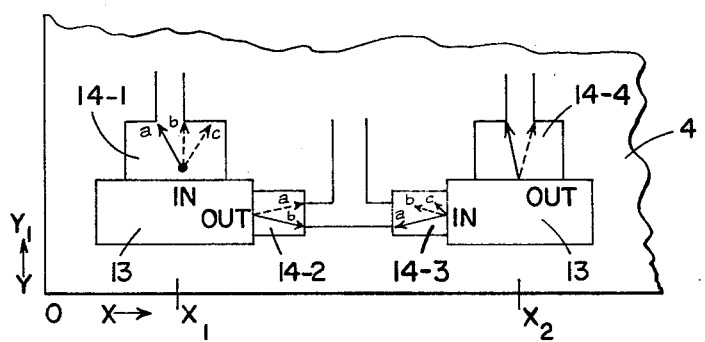
FIG. 3 is a top plan view of FIG. 2 showing a schematic representation of the intercoupling means.

The general operation of the intercoupling means 14 is shown in FIG. 3. Intercoupling means 14-1 may be schematically represented by a multi-position switch having first, second and third positions a-c respectively, connected to the input of a typical circuit 13. For purposes of testing, prior to configuration of the plural circuits 13 on body 11, position 14-1c is provided so that individual unit circuits 13 may be isolated for testing. After testing of each of the individual circuits 13 on the body, a map of functional and non-functional circuits on the body 11 may be drawn showing good and bad circuits 13 according to their location on the upper surface 12 of body 11.

Figure 4:
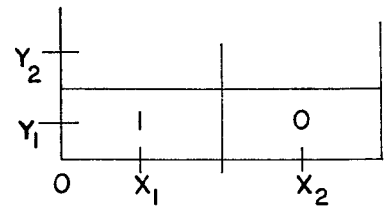
FIG. 4 is an X-Y coordinate map representation of the functional and non-functional circuits of FIG. 3.

A Cartesian coordinate system may be used as in FIG. 4 which shows a portion of the corresponding map of the spaced unit circuits 13 of FIG. 3. A "1" represents a functional circuit, and a "0" represents a non-functional circuit.

Turning now to configuration of the general block diagram of FIG. 3, circuit 13 having coordinates $x1, y1$ has been determined, as shown by the map of FIG. 4, to be functional and thus it may be advantageously configured into the overall large scale circuit. Using the map of FIG. 4, intercoupling means 14-1 may be placed in either position "a" or position "b" to thereby connect circuit 13 $x1, y1$ to either of the positions which proves most advantageous to connect up and utilize the maximum number of functional circuits 13. Similarly, the output of circuit 13 $x1, y1$ may be connected by means 14-2 to either positions $a$ or $b$. Circuit 13 at location $x2, y1$ can be seen by FIG. 4 to be non-functional and thus intercoupling means 14-3 and 14-4 may be placed in positions which disconnect non-functional circuit 13 $x2, y1$ from the other functional circuits. Similarly, intercoupling means 14-3 and 14-4 may also provide means for disconnecting power from 13 $x2, y1$ to minimize body 11 power dissipation. Thus it can be seen that there is provided a pattern of spaced pre-determined semiconductor circuits 13 formed in a planar surface 12 of a body 11, in combination with intercoupling means 14 formed in the body 11 adjacent and connected to each of said circuits and capable of assuming first and second conditions, and a plurality of conductive paths 16 carried by the body 11 connecting said intercoupling means 14. This combination provides, by selective decoupling of non-functional circuits or alternatively coupling of functional circuits, a configurable massive monolithic integrated circuit.

Figure 5:
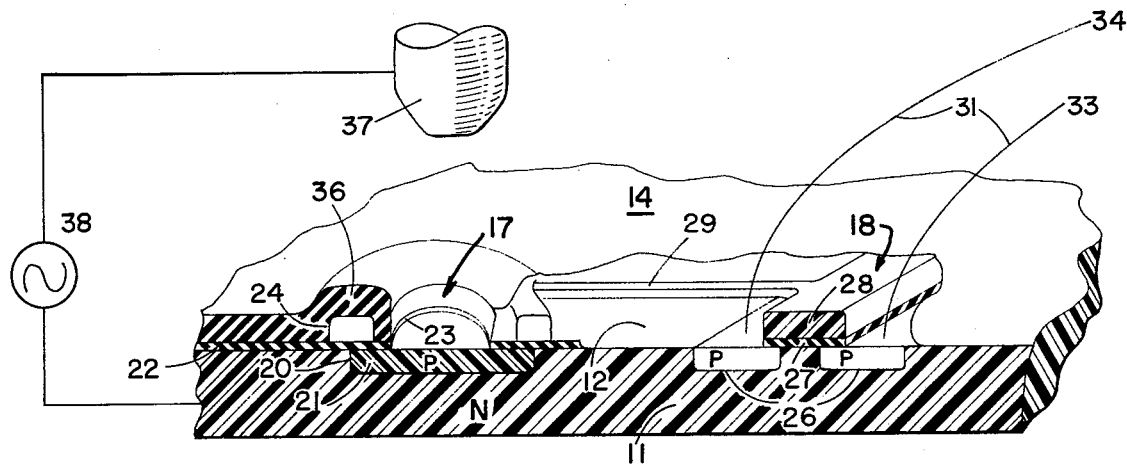
FIG. 5 is a cross-sectional isometric view of an intercoupling means formed in the surface of a semiconductor body in accord with the present invention.

A preferred embodiment of the intercoupling means 14 is shown in FIG. 5. Intercoupling means 14 includes avalanche charging element (ACE) 17, in combination with field effect transistor 18, both formed in the body 11. In organizing a large scale integrated circuit, intercoupling means is positioned adjacent to and is connected to individual circuits 13, also formed in the body 11. Avalanche charging element 17 includes a P type region 21 formed in an N type body 11 and extending to the planar surface 12 of said body. An insulating layer 22 is formed on the planar surface 12 of body 11, and an aperture or window 23 is formed in said layer to expose a portion of P region 21. A conductive ring 24 is formed on layer 22 and is positioned to substantially overlay the outer periphery of P region 21.

Field effect transistor 18 is formed by conventional MOS transistor processing techniques such as the silicon gate process well known in the art. If desired, the respective regions of transistor 18 may be formed simultaneously with the avalanche charging element 17 and other conventional circuitry formed in the entire wafer 11. Transistor 18 includes spaced source and drain regions 26 formed in the body 11 and extending to the planar surface 12. A gate oxide layer 27 is formed on planar surface 12 overlying the body surface lying between the spaced source and drain regions 26. Gate oxide layer 27 may be formed as a portion of layer 22 of avalanche charging element 17. Gate electrode 28 is formed on the surface of oxide layer 27 and generally overlies the wafer surface between spaced source and drain regions 26. Gate electrode 28 is connected via conductive path 29 to the conductive ring 24 of avalanche charging element 17. If desired, the gate electrode 28, conductive path 29 and conductive ring 24 may be simultaneously formed as a patterned polysilicon layer using the conventional silicon gate process. Lead means 31, connected to source and drain regions 26, may be additional metallization conductive paths carried by the body 11.

In this preferred embodiment, the FET provides a first low impedance condition between lead means 33 and 34 when a charge signal is coupled to gate electrode 28 and a second high impedance condition between the lead means 33 and 34 when a charge signal is removed from gate electrode 28. The alternate low or high impedance path thereby couples or alternatively decouples circuits connected to lead means 33 and 34. An insulating layer 36 is formed on the entire upper surface of the body and an aperture provided to expose a portion of P region 21 of avalanche charging element 17.

Turning to the configuration of the circuit connected to lead means 33 and 34, a high impedance condition is provided therebetween due to the lack of charge on gate electrode 28 as fabricated. If, however, a low impedance condition is desired between lead means 33 and 34 a probe 37 is positioned to contact the exposed portion of P region 21 and a voltage means 38 is applied between said probe 37 and said body 11 to bias the avalanche charging element PN junction 20 with a voltage of sufficient magnitude to cause the junction to avalanche. Charge carriers resulting from the avalanche mechanism tunnel to conductive ring 24 and via conductive path 29 to gate electrode 28 to thereby affect a channel inversion in the upper surface of the N, substrate lying between said spaced P type source and drain regions 26. The inversion effects normal operation of transistor 18 and thus provides a low impedance path between said source and drain region and correspondingly between said lead means 33 and 34. Removal of said probe from contact with P region 21 causes the avalanching of the PN junction 20 between the P region 21 and the body 11 to cease. However, charge carriers remain trapped at conductive ring 24 and at gate electrode 28 and are isolated in said metal layers by insulating layer 36 and 22. Thus charge remains at gate electrode 28 and thereby holds transistor 18 in a low impedance condition. The stored charge holds the transistor on for extended periods of time and only charge leaking off over periods of years would cause the transistor to switch to a high impedance condition. The ACE device may be erased by exposure to ultra-violet or X-ray radiation.

Thus it is apparent intercoupling means 14 has been provided in the body 11 adjacent each of said circuits 13 which may be located in a pre-determined spaced pattern in the surface 12 of body 11. A plurality of intercoupling means as was previously described may now be organized adjacent each of said semiconductor circuits 13 in a body 11 and after subsequent testing of each of said circuits, a probe 37, having voltage means 38 attached thereto, may be selectively stepped to each of said intercoupling means 14 and utilized to configure the entire array of circuits on body 11, to thus provide a large scale functional integrated circuit.

Although the intercoupling means 14 herein described is preferred, a number of other fuses or antifuses, that is, devices having the capability of assuming a first low impedance condition and a second high impedance condition, may be used.

The intercoupling means formed in the surface of a semiconductor body may be advantageously used in combination with a predetermined organization of large scale integrated circuits. Imperfections present in the fabrication of a large scale integrated circuit may be circumvented and maximum utilization of functional circuitry on the body may be realized by configuration of functional circuits using intercoupling means. Particular advantage may be had of the present invention in high density semiconductor memory applications, such as a random access memory as in the specific embodiment to now be described.

Figure 6:
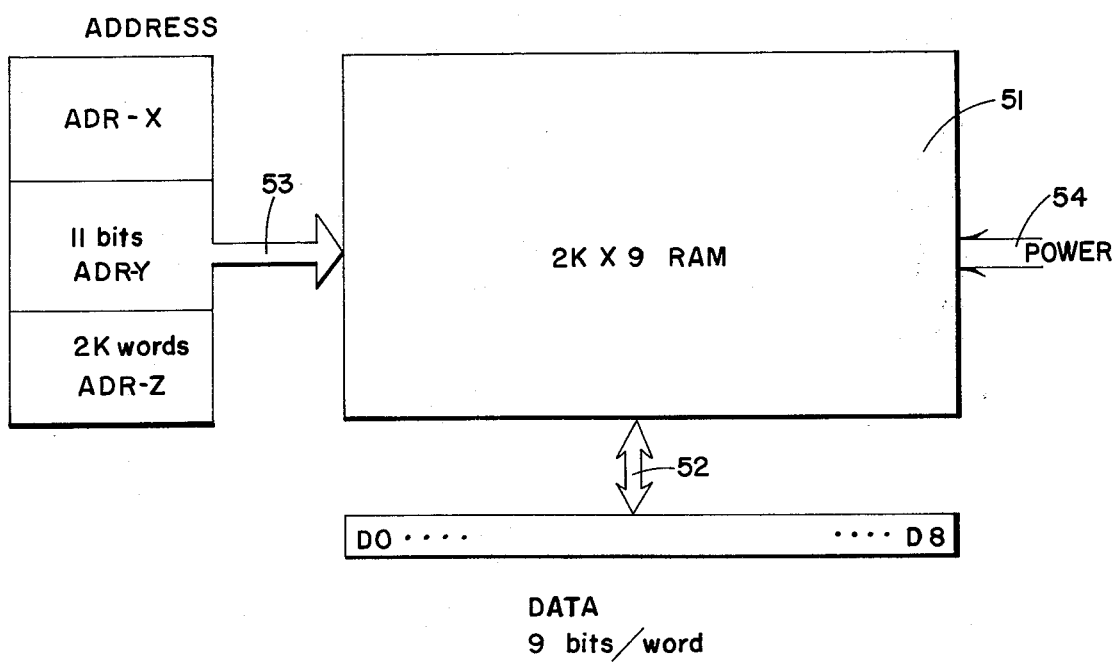
FIG. 6 is a block diagram of the overall organization of a random access memory in accord with the present invention.

The overall organization of a random access memory embodying the present invention is shown in FIG. 6. Briefly the organization provides a main storage suitable for incorporation as a main storage array or a portion or a main storage array of a memory system within the hierarchy of digital data processing systems. In this embodiment, a 2,048 word, 9 bit per word, random access memory 51 includes an input/output data bus 52 wherein plural RAM storage locations may be accessed to perform a read or write operation. A 9 bit data bus 52 provides access to data bits D0–D8. An address bus 53 provides address of the 2,048 words by allocation of 11 address bits to provide a three dimensional address, ADR-X, ADR-Y and ADR-Z. A power bus 54 supplies power to the memory 51.

Figure 7:
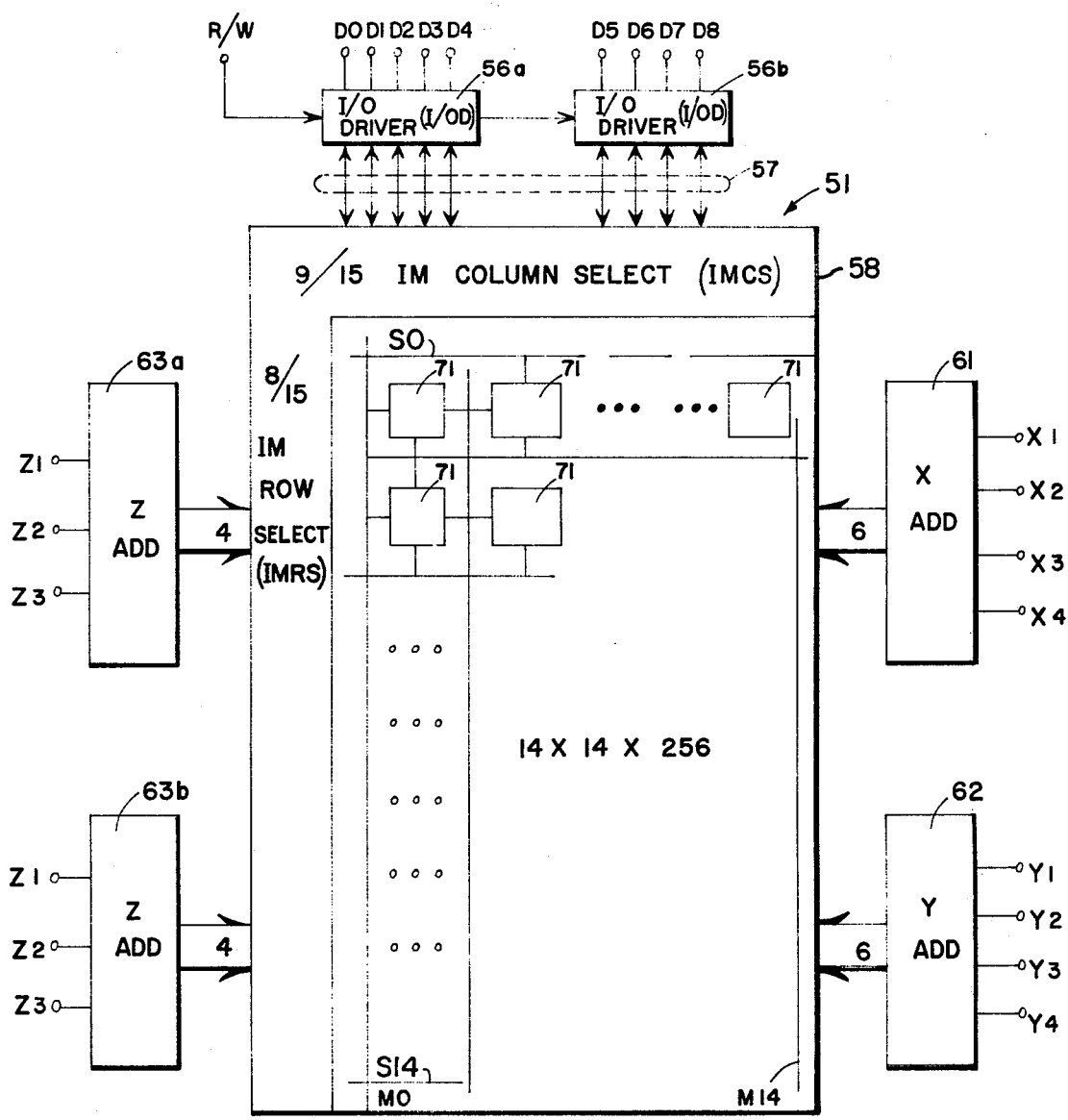
FIG. 7 is a more detailed block diagram of the random access memory of FIG. 6 showing address and data circuitry connected to the semiconductor body including column and row select intercoupling means, semiconductor unit circuits spaced in rows and columns, and intersecting data and circuit select buses.

Referring to FIG. 7, the memory 51 sub-system architecture is shown. Sub-system 51 includes input/output drivers (I/OD) 56a and 56b connected to the data D0–D8 input/output of the memory 51. A read/write (R/W) control line is connected to I/OD 56a and 56b. Data is transferred between semiconductor wafer 58 and I/OD 56a and 56b via 9 line data bus 57.

Memory 51 further includes an X dimension address, X-Add encoder 61, having inputs X1–X4 derived from the 11 bit address hereinafter discussed in the address bit allocation of FIG. 8. The output of encoder 61 is connected via a 6 line address bus to wafer 58. In like manner a Y dimension address, Y-add encoder 62, has inputs Y1–Y4 derived from the 11 bit address hereinafter described and has a 6 line data bus connected to wafer 58.

The Z dimension address is also derived from the 11 bit address allocation hereafter described and has inputs Z1–Z3 connected to the inputs of Z address 63a and 63b which each provide a four line data output bus connected to wafer 58. Power bus 54, as previously discussed in connection with FIG. 6, provides power to memory 51 including address circuitry, I/OD circuitry and semiconductor body or wafer 58 circuitry.

The semiconductor body or wafer 58 includes a plurality or row select buses S0–S14 carried by wafer 58, and a plurality of data buses M0–M14 formed in columns on wafer 58 and intersecting rows S0–S14, shown in FIG. 7. The semiconductor wafer further includes a plurality of semiconductor unit circuits 71 formed in the wafer portions defined by the intersecting data buses M0–M14 and the row select buses S0–S14. Each of the semiconductor unit circuits 71 is connected to adjacent data bus columns and adjacent address row select buses.

Briefly, and as will be hereinafter apparent, each of the semiconductor unit circuits 71 may include a small scale 256 bit, 16 × 16 random access memory. Further, interconnecting means of the type previously described are included within each circuit 71 for configuration of each unit circuit, as will be described in conjunction with FIG. 9. It has been found that the fabrication of 14 unit circuits in each row and 14 unit circuits in each column will provide at least a functional yield of an 8 row, 9 column unit circuit array utilizing the configuration technique hereinafter described.

Wafer or body 58 further includes plural interconnecting means (IM) formed in columns as column select circuitry (IMCS) and further positioned on the periphery of the wafer 58 and capable of interconnecting any of select data buses M0–M14 to any of the 9 line data bus 57 connected to the wafer. As will be hereinafter evident, once unit circuits are configured to selected data buses then a group of additional intercoupling means, such as the intercoupling means previously discussed, and as shown in FIG. 5, are used to connect nine of the selected data buses within the group M0–M14 to the nine line data bus 57. The group of interconnecting means, IMCS, further decouples undesired buses. In like manner a group of interconnecting means formed as a row select circuitry IMRS is provided on wafer 58 to similarly connect eight of the selected rows within the group S0–S14, to the eight line output data output of the Z dimension address lines connected to wafer 58. Reserving the nine column functional circuit yield for the data input and output, the 8 row select functional wafer yield may be utilized as a portion of the 11 bit address scheme.

Figure 8:
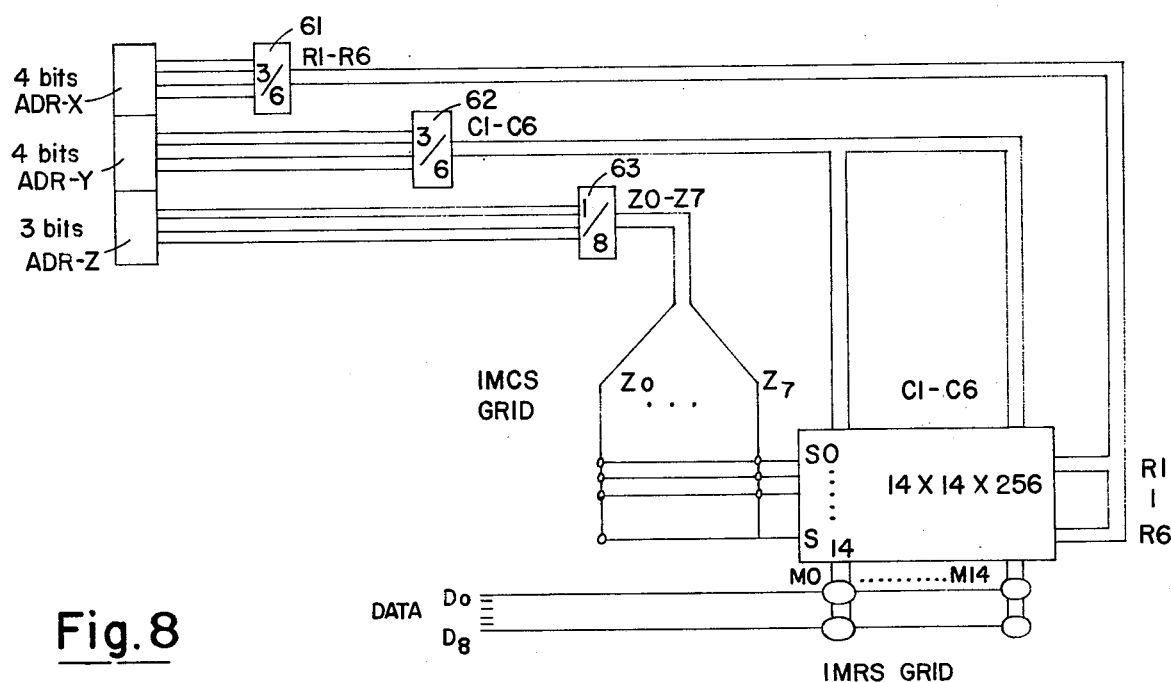
FIG. 8 is a schematic diagram showing the address busing and intercoupling means column select grid, and the data busing and intercoupling means row select grid.

The memory 51 further includes the address bit allocation circuitry and peripheral interconnecting means circuitry, shown in FIG. 8. Of the 11 bit address input to the memory 51, 4 bits are allocated for the X dimension circuitry, as ADR-X, and connected to an encoder 61 to provide a three out of six code as disclosed in co-pending application PSEUDO-COMPLEMENTARY DECODE DRIVER, Ser. No. 368,855, filed June 11, 1973, abandoned in favor of application Ser. No. 522,433, filed Nov. 11, 1974, now U.S. Pat. No. 3,970,865 issued July 20, 1976 having the same inventor and assignee as the present application. Briefly, four of the address bits are encoded to form six address signals. The six address signals are connected via six fixed address lines, R1–R6, which are routed to each of the semiconductor unit circuits 71 by a first fixed metallization layer. The metallization layer is connected in common to each of the unit circuits 71 in the wafer or body. As will be shown in FIG. 10, within each unit circuit 71, the six signals are connected to decoders which provide 16 X-select lines connected to the X coordinates of the 256 random access memory storage locations.

Similarly, 4 bits are allocated as Y dimension circuitry, as ADR-Y, and connected to an encoder 62 to provide six address lines which are connected to lines C1–C6 formed as a second metallization layer carried by the wafer. Lines C1–C6 are also connected in common to each of the unit circuits 71. Similarly, the Y lines are connected to Y decoders within each unit circuit 71 to provide 16 Y-select lines connected to the Y coordinates of the 256 random access memory storage locations in each of the unit circuits 71. The remaining three bits of the 11 bit address are allocated and circuitry is connected to provide eight Z dimension lines. As previously described, the configuration technique utilized in the present invention identifies an eight row select, functional yield within the 15, S0–S14 rows carried by the semiconductor wafer.

The memory 51 further includes interconnecting grids IMCS and IMRS. IMCS grid organization is shown, in FIG. 8. Each of the parallel row select lines, Z0–Z7, is positioned to intersect in an angular relationship the wafer or body row select lines S0–S14. At each intersection an interconnecting means, IM, as previously discussed is positioned. Actuation of the interconnecting means at any of the intersections, it is apparent, couples any of the lines Z0–Z7 to any of the rows on the wafer S0–S14. Likewise, column lines M0–M14 carried by the wafer intersect with data lines D0–D8 and an IM is positioned at each intersection. Thus any of wafer columns M0–M14 may be selected and coupled to any of the data output lines D0–D8 by actuation or change in the impedance of the IM circuit at a selected intersection.

Figure 9:
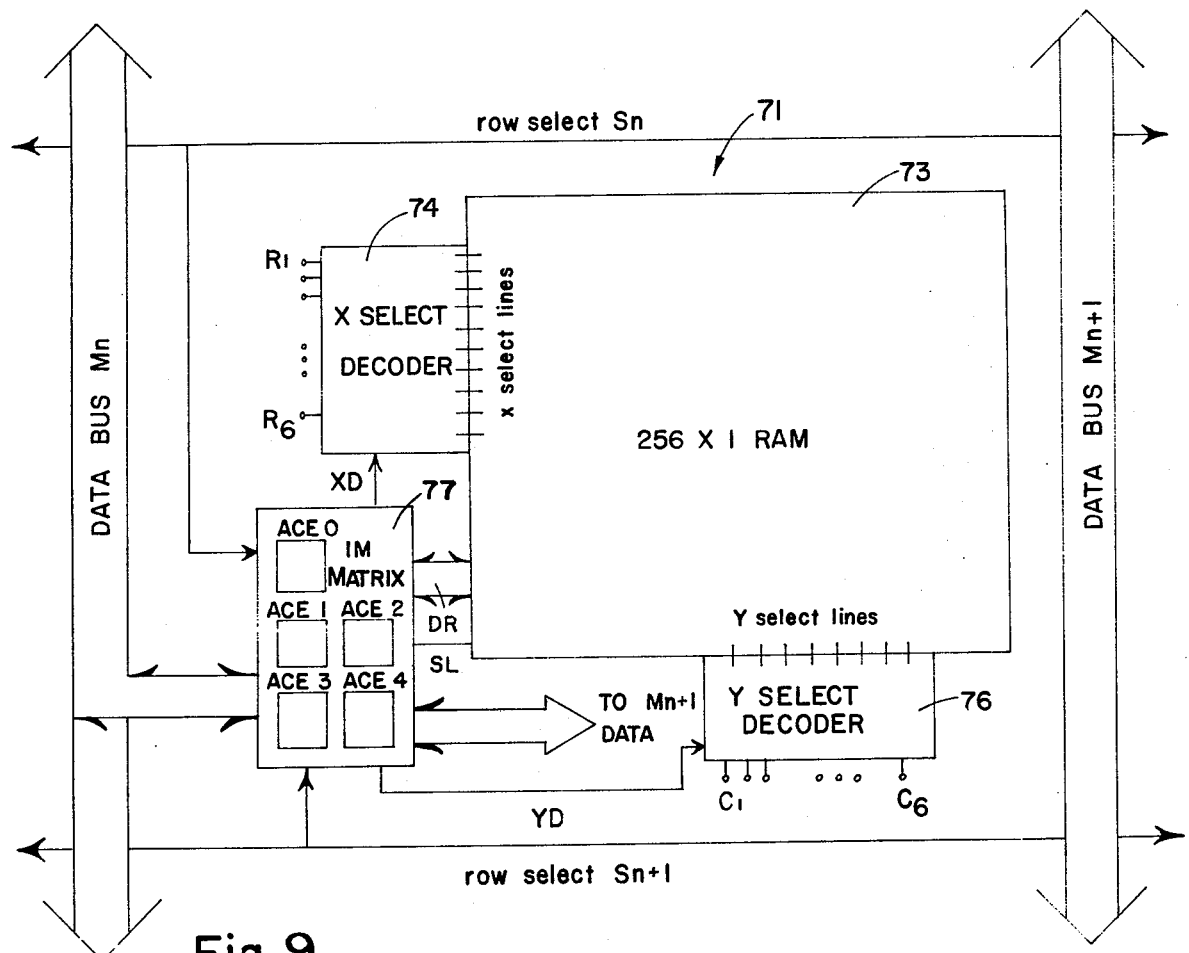
FIG. 9 is a block diagram showing data buses, intersecting row select buses and a semiconductor unit circuit positioned at the intersection thereof including a 256 bit, X-Y random access memory, associated X and Y select decoders and an intercoupling matrix including five matrixed avalanche charging elements.

The memory 51 further includes a plurality of semiconductor unit circuits 71, shown in FIG. 9. Defined by the intersection of data buses $Mn$ and $Mn+1$ and row select $Sn$ and $Sn+1$, each unit circuit 71 includes a conventional random access memory (RAM) 73 formed in the upper planar surface of the wafer, such as a 256 bit, 16 × 16 two dimensional array. RAM 73 has an X select decoder 74 positioned adjacent thereto and connected to the 16 "X" select lines of the 256 bit RAM. The X select decoder 74 has 6 input lines, R1–R6, connected to the first fixed layer of metallization and connected in common to each of the R1–R6 inputs to unit circuits 71 positioned on the wafer. Likewise Y select decoder 76 is positioned adjacent RAM 73 and has 16 "Y" select lines connected to the 16 Y coordinates of the RAM. Y select decoder 76 has six input lines C1–C6 connected to the common, C1–C6, second fixed layer of metallization on the wafer and connected in common to each of the unit circuits 71. Unit circuit 71 further includes IM matrix 77 including five avalanche control elements ACE0-4. The matrix interconnection will be hereinafter apparent from the ACE interconnection schematic, shown in FIG. 10. IM matrix 77 is connected to data buses $Mn$ and $Mn+1$ and row select $Sn$ and $Sn+1$. Further, IM matrix 77 provides an output XD to X select decoder 74 and a second output YD to Y select decoder 76. IM matrix 77 is connected via data bus DR to RAM 73 and further connected by select line SL to RAM 73.

FIG. 10 shows the unit circuit 71 selection schematic. Avalanche charging elements ACE0-4 are matrixed to provide signals to the respective transistor gates as indicated. That is, gates indicating ACE1 or ACE4 would be responsive to the changing condition of either ACE1 or ACE4. X select decoder 74 has inputs R1'–R6' which are connected to the outputs of OR gates $Ra$–$Rf$, the MOS sources being connected to lines R1–R6 as previously discussed. A first input to OR gates $Ra$–$Rf$ is connected to all ACE circuits except ACE0 and represents line XD as previously discussed in conjunction with FIG. 9. A second input to gates $Ra$–$Rf$ is connected to test pad Vdt whereby a test voltage may be applied during the testing of each individual unit circuit 71. The Vdt pad is also connected to a second input of OR gates $Ca$–$Cf$. Similarly, gates $Ca$–$Cf$ have outputs connected to the inputs of Y select decoder 76 and are also connected to the common second layer of fixed metallization lines C1–C6. A second input to gates $Ca$–$Cf$ is connected to the ACE matrix to all ACE circuits except ACE0.

Row select line $Sn$ is connected to an input terminal of transistor switch 104 having a gate terminal connected to ACE1 and ACE2 of the ACE matrix. The output terminal of transistor switch 104 is connected to the gate terminal of transistor 102 and also the gate terminal of transistor 103. Transistors 102 and 103 have their input terminals connected to D and $\overline{D}$ lines, that is, the DR bus interfacing with the RAM 73 as previously described and in conjunction with FIG. 9. The output terminal of transistor 102 is connected to the input terminal of transistor 100 and the input terminal of transistor 100'. The output terminal of transistor 103 is connected to the input terminal of transistor 101 and also connected to the input terminal of transistor 101'.

Transistor 100 has the output terminal connected to data bus D line and transistor 101 has the output terminal connected to the $\overline{D}$ line of data bus $Mn$. The gates of transistors 100 and 101 are connected to the ACE1 and ACE4 matrix. Gate terminals of transistors 100' and 101' are connected together and connected to the ACE2 and ACE3 matrix. The output terminal of transistor 100' is connected to the D data line of data bus M$n+n$ and the output terminal of transistor 101' is connected to the $\overline{D}$ line of data bus M$n+1$. The gate of transistor 103 is connected to the output terminal of transistor 105 which has the input terminal connected to row select line S$n+1$. The gate of transistor 105 is connected to the ACE3 and ACE4 matrix. Transistor 107 has the input terminal connected to the gate of transistor 107 and also connected to the $V_{dt}$ pad. The output terminal of transistor 107 is connected to the output terminal of transistor 106 which has the input terminal connected to the common $V_{dd}$ line L carried by the wafer and routed throughout the wafer to each of the semiconductor unit circuits 71.

The gate of transistor 106 is connected to the XD line and also connected to all ACE circuits in the ACE matrix except ACE0. The output terminal of transistor 107 is also connected to the input terminal of transistor 108, which also has the output terminal connected to the $V_{cc}$ line, which is carried by the wafer and routed throughout the wafer to each circuit 71. The gate of transistor 108 is connected to ACE0. The input terminal of transistor 108 is also connected to the $V_{dd}$ terminals of X select decoder 74 and also the $V_{dd}$ terminal of Y select decoder 76. The $V_{cc}$ terminal of decoder 76 is connected to the $V_{cc}$ common line routed throughout the wafer.

Each unit circuit 71 may now be configured by operation of the intercoupling circuitry included therein, FIG. 10. It is clear that, on the one hand, when ACE1 or ACE2 provides a signal at the gate of transistor 104, the row select S$n$ is connected to the gates of transistors 102 and 103 which provide a conductive path from RAM 73 via bus DR only when row select S$n$ line is addressed. On the other hand, if ACE3 or ACE4 provide a signal to the gate of transistor 105, then transistor 105 conducts to connect row select S$n+1$ to the gates of transistors 102 and 103 and thus transistors 102 and 103 couple data to and from RAM 73 only when said S$n+1$ line is addressed.

Further, the data bused to and from RAM 73 may be further switched to either data bus M$n$ or alternatively data bus M$n+1$. If on the one hand, ACE1 or ACE4 energizes the gates of transistors 100 and 101 then these transistors couple the output of the RAM to data bus M$n$. If on the other hand, ACE2 or ACE3 provide a signal at the gates of transistors 100' and 101' then the data from RAM 73 is coupled to data bus M$n+1$. It is further readily apparent that during the testing sycle a voltage means $V_{dt}$ applied to pad $V_{dt}$ actuates gates R$a$-R$f$ and C$a$-C$f$ to permit the address of the decoder 74 and 76 during the testing of individual unit circuits 71. It is also possible to energize these respective gates by providing a signal at the other input from all ACEs except ACE0. Further actuation of ACE0 provides a signal input to the gate of transistor 108 and actuates transistor 108. The action of transistor 108 is to connect all power lines ($V_{dd}$) in the RAM 73 unit cell and the decoders 74 and 76 to ground ($V_{cc}$) and thus prevent them from introducing spurious signals onto the data lines in the event that RAM 73 unit cell is determined to be unusable.

Thus it is apparent that each individual circuit 71 may be individually probed and tested and one of the five ACE0-4 may be energized to connect the unit circuit 71 to either of adjacent row select address lines, and either of adjacent data buses. Further each unit circuit 71, if non-functional or not required in a particular configuration, may be completely deenergized to minimize power dissipation on the wafer.

Turning to configuration of the plural units circuits 71 on the wafer, a map is first provided, as shown in FIG. 11, defining the cartesian coordinates of functional and non-functional unit circuits as previously discussed in conjunction with FIG. 4. FIG. 11 has respective "ones" and "zero" arranged in a map to indicate the status of each unit circuit on the wafer and its corresponding location on the wafer. A "zero" indicates a nonfunctional unit circuit, and a "one" indicates a functional circuit.

The next step in configuring the unit circuits on the wafer is to select which intersections in the matrix have the greater number of functional unit circuits located adjacent thereto and then grouping or clustering said circuits about rows and columns to arrive at the desired 8 row 9 column array of functional circuits. This step in the configuring of the wafer may be manually accomplished, or as will be hereinafter described, may be accomplished with the aid of a small scientific computer such as an IBM 1130. Referring to FIG. 12, a small portion of a randomly generated matrix map of functional and non-functional circuits is shown. An initial step in the configuration of the FIG. 12 matrix is the summation of the number of the functional circuits adjacent to a particular column-row intersection. For example the $X_{n'}Y_n$ intersection of FIG. 12 has a node sum equal to 0 as shown in the circle superimposed over the intersection. The node sum of intersection $X_{n'}Y_n+1$, having two functional circuits located adjacent thereto, has a node sum equal to two as indicated in the circle at this intersection. Next the node sum of intersection $X_{n'}Y_n+2$ has a node sum of 4, intersection $X_nY_n+3$ has a node sum of 3 and intersection $X_nY_n+4$ has a node sum of 1. Proceeding thusly throughout the entire map of functional circuits, node sums may be obtained for each of the column-row intersections. Next the matrix is searched for node sums equal to zero, such as $X_{n'}Y_n$ in FIG. 12. These intersections and consequently either the $X_n$ row or the $Y_n$ column are eliminated, since this intersection would not provide the required functional unit circuits for configuration.

Referring to FIG. 11, it is apparent that in the actual wafer, columns M1, M2, M3, M5, M7, M9, M10, M12, Mand M13 have been selected. Rows S1-4, 7, 8, 10 and 11 have been selected as those rows which provide in combination with the selected columns the required functional circuits to the selected adjacent data and row select buses. It is apparent from FIG. 11 that the S1, M1 intersection has a node sum of 2. The functional circuit in the lower right quadrant of the intersection is circled and a line is drawn to the lower right intersection to indicate this circuit is to be configured to this intersection. Although the line is drawn as a diagonal to the intersection on the map, the configuration is to the adjacent buses which meet at the selected intersection. The intercoupling means in the actual circuit is configured to provide a unit circuit row address conducting path to adjacent line S1, and the unit circuit data intercoupling means is configured to provide a conducting path to the adjacent data bus column M1.

A similar routine is performed throughout the map of the integrated circuit to group or cluster said unit circuits, as desired, to adjacent usable row select and column data buses. Correspondingly, once the map has been determined a probe may be manually positioned, or automatically positioned via computer, control, to contact the specific interconnecting means on each of said unit circuits and the interconnecting means operated to couple or decouple each of said functional circuits according to the configuration pattern of FIG. 11. Unused functional circuits, not required for configuration, may have power disabled from them to reduce the wafer power dissipation.

Manual mapping and solution of the matrix may of course, be difficult, time consuming and involve considerable trial and error. A preferred alternative is to use a programmable probe in combination with a small computer. An E-Sort probe such as a Pacific Western model may be programmed and controlled by paper tape, where the paper tape controls the positioning of the probe on the wafer. Thus during the testing process the probe may sequentially step from a first unit circuit 71 to a second unit circuit 71, applying a test voltage to said circuit and functionally testing said circuit.

Further the probe may provide a paper tape which may present unit circuit locations as shown on the map of FIG. 11 and indicate the status of the circuit in that location. Next the paper tape may be fed into a small scientific computer, such as IBM 1130, which through an appropriate algorithm, calculates the desired columns and rows and provide a paper tape output. Moreover, the computer tape may be formated to be directly compatible with the programmable probe. Thus, the first pass of the probe provides a tape of functional test results, and the next pass of the probe configures the wafer as determined by the computer. The probe may then accomplish the entire hookup of unit circuits into a full functional array very simply and at very low cost without the necessity of masks or other steps associated with other configuration techniques. Of course the probe further connects the selected rows and columns to the data input/output bus by changing the condition of the desired interconnecting means in the IMRS grid peripherally located on the wafer as previously described in conjunction with FIG. 8. Likewise the IMCS grid, also peripherally located on the wafer, may be similarly configured to connect the Z coordinate address to selected rows in the configured wafer.

Thus it is apparent that intercoupling means capable of assuming first and second conditions has been formed in a semiconductor wafer adjacent each of predetermined spaced pattern of semiconductor circuits in a wafer and the interconnecting means is further operative to selectively couple functional circuits or decouple non-functional circuits. Further the combination of the interconnecting means, positioned adjacent each of pre-determined unit circuits, and plural interconnecting conductive paths provide an easily and inexpensively large scale integrated circuit. Functional circuits may be easily configured, that is grouped or clustered, with other like functional circuits to form a large scale integrated circuit. Non-functional circuits or functional circuits not required for a particular configuration may be decoupled and power removed to thereby limit wafer power dissipation.

It is clear that the technique may readily be used in a number of applications where a large scale integrated circuit is advantageous, such as in random access memories, serial memories, and combinations thereof such as serial shift-parallel access memories. Further the configurable integrated circuit may be combined with high speed bipolar or Schottky drivers and address circuitry. The combination of these circuits in an overall memory provides maximum functional utilization of a MOS wafer, and retains the inherent speed of bipolar and Schottky devices.

We claim:

1. In an integrated circuit, a semiconductor body having a major surface;
    an array of semiconductor circuits formed in said major surface, a plurality of said semiconductor circuits being assigned a functional status and the remainder thereof being assigned a non-functional status;
    a pattern of conductive paths of extended length provided over said body surface interlaced with the semiconductor circuit array; and
    a plurality of individually switchable semiconductor intercoupling means formed in surface regions of said body adjacent to each of said semiconductor circuits and disposed between adjacent ones of said semiconductor circuits and adjacent ones of said conductive paths, each of said intercoupling means having a high impedance state from which it is selectively switchable to a low impedance state by the application thereto of electrical energy, and from which low impedance state it is selectively switchable to said high impedance state by the application thereto of radiant energy, said plurality of functional semiconductor circuits being coupled to the adjacent conductive paths by means of connection to semiconductor intercoupling means that are in their low impedance state, and said non-functional semiconductor circuits being decoupled from the adjacent conductive paths by means of connection to semiconductor intercoupling means that are in their high impedance state.

2. The invention according to claim 1, wherein each of said semiconductor intercoupling means includes a semiconductor junction portion capable of avalanche charge carrier conduction, and a field effect transistor portion connected to receive charge carriers resulting from avalanching said junction portion and capable of indefinitely storing said received charge carriers to thereby place said field effect transistor portion in a persistent energized state of low impedance so long as it is storing charge carriers.

3. The invention according to claim 1, wherein said pattern of conductive paths comprises a plurality of columns of data buses intersecting a plurality of rows of address buses so as to define therebetween a pattern of spaced predetermined areas in which said semiconductor circuits are disposed in unit circuits with said intercoupling means.

4. An integrated circuit as in claim 1 wherein said intercoupling means includes an avalanche charging element having an output, an FET switch having a gate terminal connected to the output of said element, and said FET having source and drain terminals providing a first low impedance condition therebetween when charge is coupled to said FET gate and a second high impedance condition therebetween when charge is removed from said FET gate thereby to couple circuits connected to said FET source and drain terminals when charge is coupled to said gate, said element having an access aperture to receive an electrical probe and said element being responsive to an electrical signal of sufficient amplitude to cause said element to avalanche to provide charge carriers at the gate of said FET switch to actuate said switch, said charge carriers being trapped at said FET gate upon subsequent removal of said probe and when said avalanching ceases.

5. An integrated circuit as in claim 4 wherein said avalanche charging element includes an N-type semiconductor body, a P region formed in the surface of said body, a first insulating layer formed on the surface of said body and having an aperture therein to expose said P region, a conductive metal ring formed on said layer and substantially overlying the outer periphery of said P region and connected to the gate terminal of said FET switch, a second insulating layer formed over the surface of the body and overlying said ring and having an aperture therein to expose said P region, so that when an electrical probe contacts said P region and a voltage is applied between said probe and said body sufficient to cause said P-N junction to avalanche, said junction provides a source of charge carriers which tunnel through said first insulating layer and are received at said conductive ring whereupon said charge actuates said FET, and when said probe is removed said carriers remain trapped at said ring and hold said FET in an actuated condition.

6. An integrated circuit as in claim 3 wherein said semiconductor circuit is a random access memory circuit and said intercoupling means includes an avalanche charging element having an output connected to an FET switch.

7. An integrated circuit as in claim 6 together with at least one peripheral interconnecting grid including first plural parallel spaced interconnect lines carried by said body and connected to unit circuits formed in said body and second plural parallel spaced interconnect lines carried by said body at substantially right angles and intersecting said first interconnect lines and providing inputs and outputs to said body, and said grid further having intercoupling means formed at each intersection.

* * * * *